US010685708B2

(12) United States Patent
Jeon et al.

(10) Patent No.: US 10,685,708 B2
(45) Date of Patent: Jun. 16, 2020

(54) SEMICONDUCTOR DEVICE INCLUDING VOLATILE AND NON-VOLATILE MEMORY CELLS

(71) Applicant: Samsung Electronics Co., Ltd., Suwon-si, Gyeonggi-do (KR)

(72) Inventors: Chang Hoon Jeon, Hwasung-si (KR); Yoo Cheol Shin, Hwasung-si (KR); Jun Hee Lim, Hwasung-si (KR); Sung Kweon Baek, Hwasung-si (KR); Chan Ho Lee, Hwasung-si (KR); Won Chul Jang, Hwasung-si (KR); Sun Gyung Hwang, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/059,317

(22) Filed: Aug. 9, 2018

(65) Prior Publication Data

US 2019/0267088 A1 Aug. 29, 2019

(30) Foreign Application Priority Data

Feb. 23, 2018 (KR) ........................ 10-2018-0021937

(51) Int. Cl.
| | |
|---|---|
| *G11C 14/00* | (2006.01) |
| *G11C 11/401* | (2006.01) |
| *H01L 27/108* | (2006.01) |
| *H01L 23/532* | (2006.01) |
| *H01L 27/11582* | (2017.01) |
| *H01L 27/105* | (2006.01) |
| *H01L 27/11573* | (2017.01) |

(52) U.S. Cl.
CPC ........ *G11C 14/0009* (2013.01); *G11C 11/401* (2013.01); *H01L 23/5329* (2013.01); *H01L 27/105* (2013.01); *H01L 27/10829* (2013.01); *H01L 27/10832* (2013.01); *H01L 27/10897* (2013.01); *H01L 27/11582* (2013.01); *H01L 27/11573* (2013.01)

(58) Field of Classification Search
CPC .............. G11C 14/0009; G11C 11/401; H01L 27/1087; H01L 27/1082; H01L 27/10897; H01L 23/5329; H01L 27/10829; H01L 27/11573

See application file for complete search history.

(56) References Cited

U.S. PATENT DOCUMENTS

| | | | |
|---|---|---|---|
| 7,050,322 B2 * | 5/2006 | Zambrano | G11C 11/005 365/145 |
| 8,574,984 B2 | 11/2013 | Anezaki | |
| 8,854,883 B2 | 10/2014 | Takashima | |

(Continued)

FOREIGN PATENT DOCUMENTS

KR 10-2010-0010410 A 2/2010

*Primary Examiner* — David Lam
(74) *Attorney, Agent, or Firm* — Harness, Dickey & Pierce, P.L.C.

(57) ABSTRACT

A semiconductor device includes a substrate having a volatile memory region and a non-volatile memory region. The volatile memory region includes a cell capacitor disposed in the substrate and a cell transistor connected to the cell capacitor. The non-volatile memory region includes a plurality of non-volatile memory cells disposed on the substrate. The volatile memory region and the non-volatile memory region are disposed side by side.

19 Claims, 10 Drawing Sheets

(56) References Cited

U.S. PATENT DOCUMENTS

| | | |
|---|---|---|
| 9,564,217 B1 | 2/2017 | Zhou et al. |
| 9,590,059 B2 | 3/2017 | Chuang et al. |
| 2008/0054485 A1 | 3/2008 | Han |
| 2011/0228603 A1* | 9/2011 | Takashima ............. G11C 14/00 |
| | | 365/185.08 |
| 2014/0061748 A1* | 3/2014 | Lee ........................ H01L 29/78 |
| | | 257/314 |
| 2015/0340366 A1 | 11/2015 | Lim et al. |
| 2016/0071591 A1 | 3/2016 | Hsu |
| 2017/0358581 A1* | 12/2017 | Cartier ................ H01L 27/1087 |

* cited by examiner

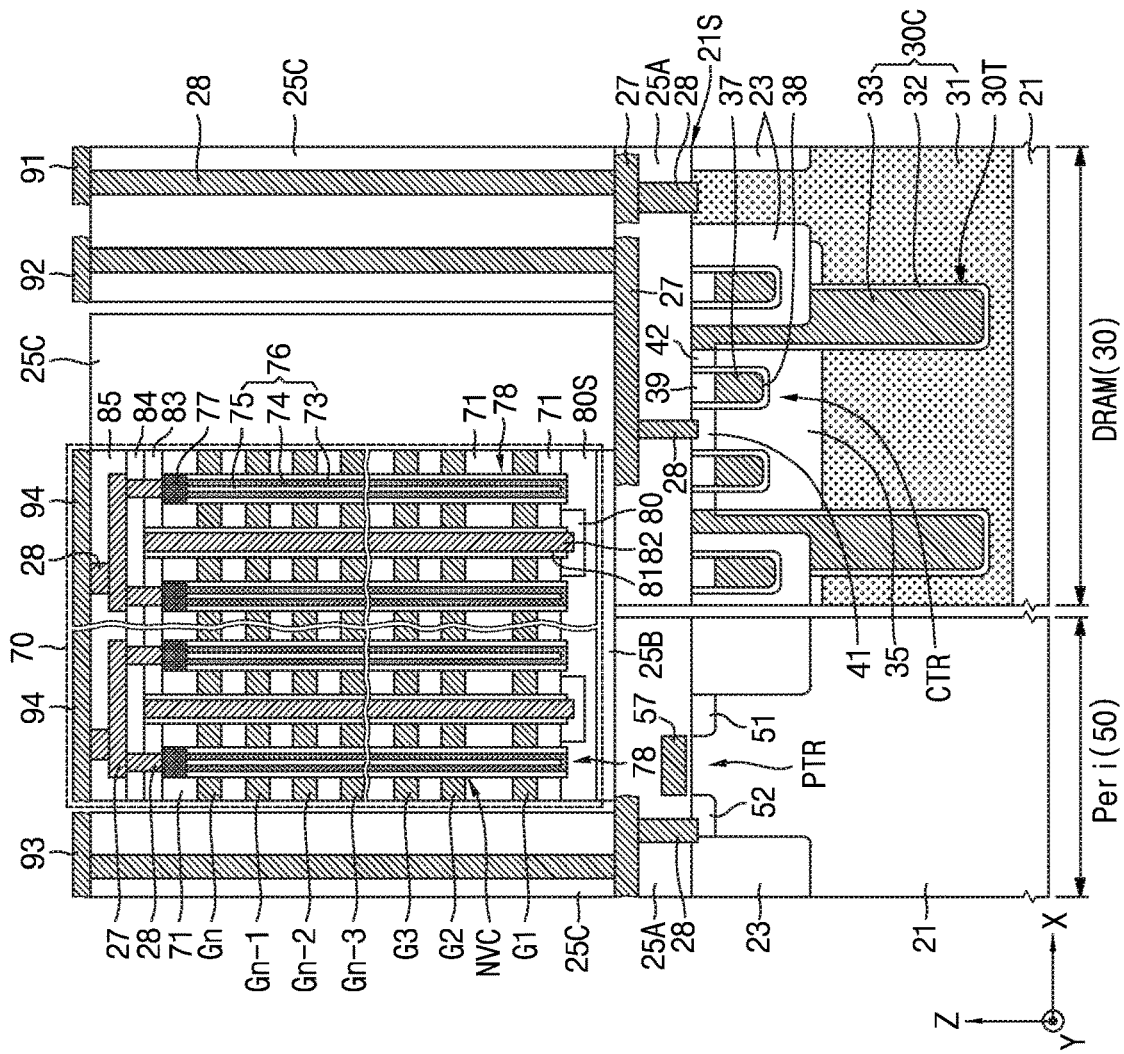
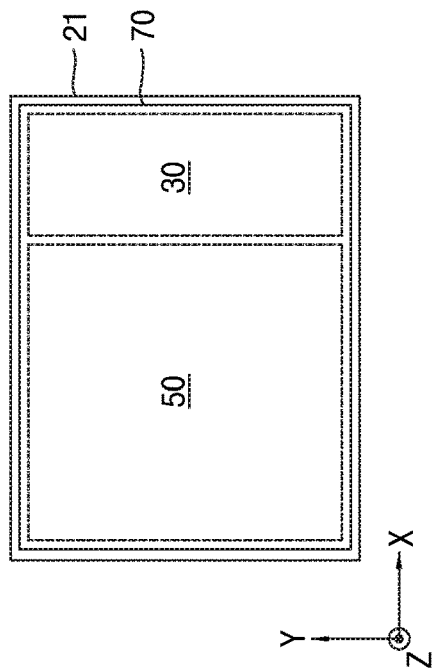
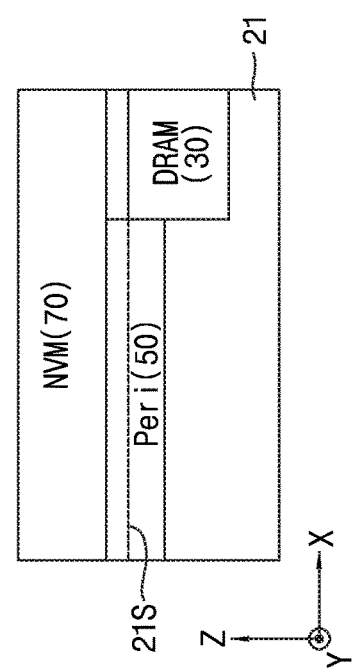
FIG. 10
FIG. 11
FIG. 12

SEMICONDUCTOR DEVICE INCLUDING VOLATILE AND NON-VOLATILE MEMORY CELLS

CROSS-REFERENCE TO RELATED APPLICATION

This U.S. non-provisional patent application claims priority under 35 U.S.C. § 119 to and the benefit of Korean Patent Application No. 10-2018-0021937, filed on Feb. 23, 2018, in the Korean Intellectual Property Office (KIPO), the disclosure of which is incorporated herein by reference in its entirety.

BACKGROUND

1. Field

The present inventive concepts relate to a semiconductor device having two or more different types of memory cells and a method of forming the same.

2. Discussion of Related Art

Multiple electronic apparatuses use a non-volatile memory device and volatile memory device. A technique for mounting a non-volatile memory device and volatile memory device on a printed circuit board (PCB) and connecting the memory devices to the PCB by wires faces limitations in the aspects of higher integration and/or faster operation.

SUMMARY

The present inventive concepts are directed to providing a semiconductor device which is advantageous for higher integration and/or faster operation.

In addition, the present inventive concepts are directed to providing a method of forming a semiconductor device which is advantageous for higher integration and/or faster operation.

A semiconductor device according to an example embodiment of the present inventive concepts includes a substrate having a volatile memory region and a non-volatile memory region. The volatile memory region includes a cell capacitor disposed in the substrate and a cell transistor connected to the cell capacitor. The non-volatile memory region includes a plurality of non-volatile memory cells disposed on the substrate. The volatile memory region and the non-volatile memory region are disposed side by side.

A semiconductor device according to an example embodiment of the present inventive concepts includes a volatile memory cell disposed in a substrate and a non-volatile memory cell disposed on the substrate.

A semiconductor device according to an example embodiment of the present inventive concepts includes a cell capacitor disposed at a lower level than an upper surface of a substrate. A cell transistor is connected to the cell capacitor. A plurality of mold layers and a plurality of non-volatile gate electrodes are alternately and repeatedly stacked on the substrate. The semiconductor device includes a channel structure passing through the plurality of mold layers and the plurality of non-volatile gate electrodes. The channel structure and the plurality of non-volatile gate electrodes constitute a plurality of non-volatile memory cells. The cell capacitor includes a first electrode disposed in the substrate, a second electrode facing the first electrode, and a capacitor dielectric layer disposed between the first electrode and the second electrode. The second electrode is disposed in a capacitor trench in the substrate.

A semiconductor device according to an example embodiment of the present inventive concepts includes a substrate having a volatile memory region and a non-volatile memory region. The volatile memory region includes a cell capacitor disposed on the substrate and a cell transistor connected to the cell capacitor. The non-volatile memory region includes a plurality of mold layers and a plurality of non-volatile gate electrodes alternately and repeatedly stacked on the substrate; and a channel structure passing through the plurality of mold layers and the plurality of non-volatile gate electrodes. The volatile memory region and the non-volatile memory region are disposed side by side.

BRIEF DESCRIPTION OF THE DRAWINGS

The above and other objects, features and advantages of the present inventive concepts will become more apparent to those of ordinary skill in the art by describing example embodiments thereof in detail with reference to the accompanying drawings, in which:

FIG. 10 is a layout showing a configuration of a semiconductor device according to an example embodiment of the present inventive concepts;

FIG. 11 is a sectional view showing a configuration of a semiconductor device according to an example embodiment of the present inventive concepts;

FIGS. 12 to 15 are sectional views showing a portion of a semiconductor device according to an example embodiment of the present inventive concepts.

DETAILED DESCRIPTION OF EXAMPLE EMBODIMENTS

Figure 1:
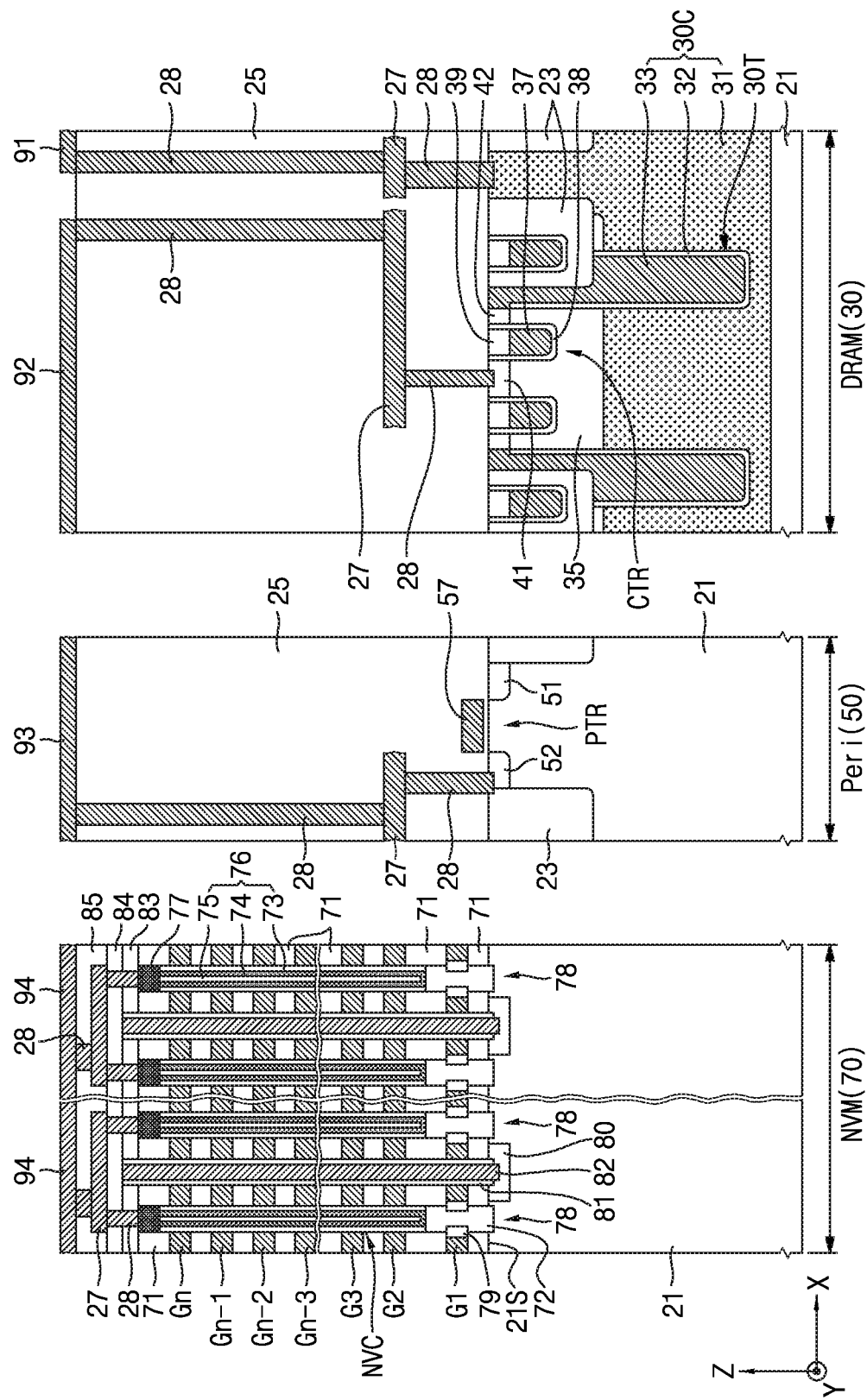
FIGS. 1 and 2 are sectional views for illustrating a semiconductor device according to an example embodiment of the present inventive concepts.
Figure 2:
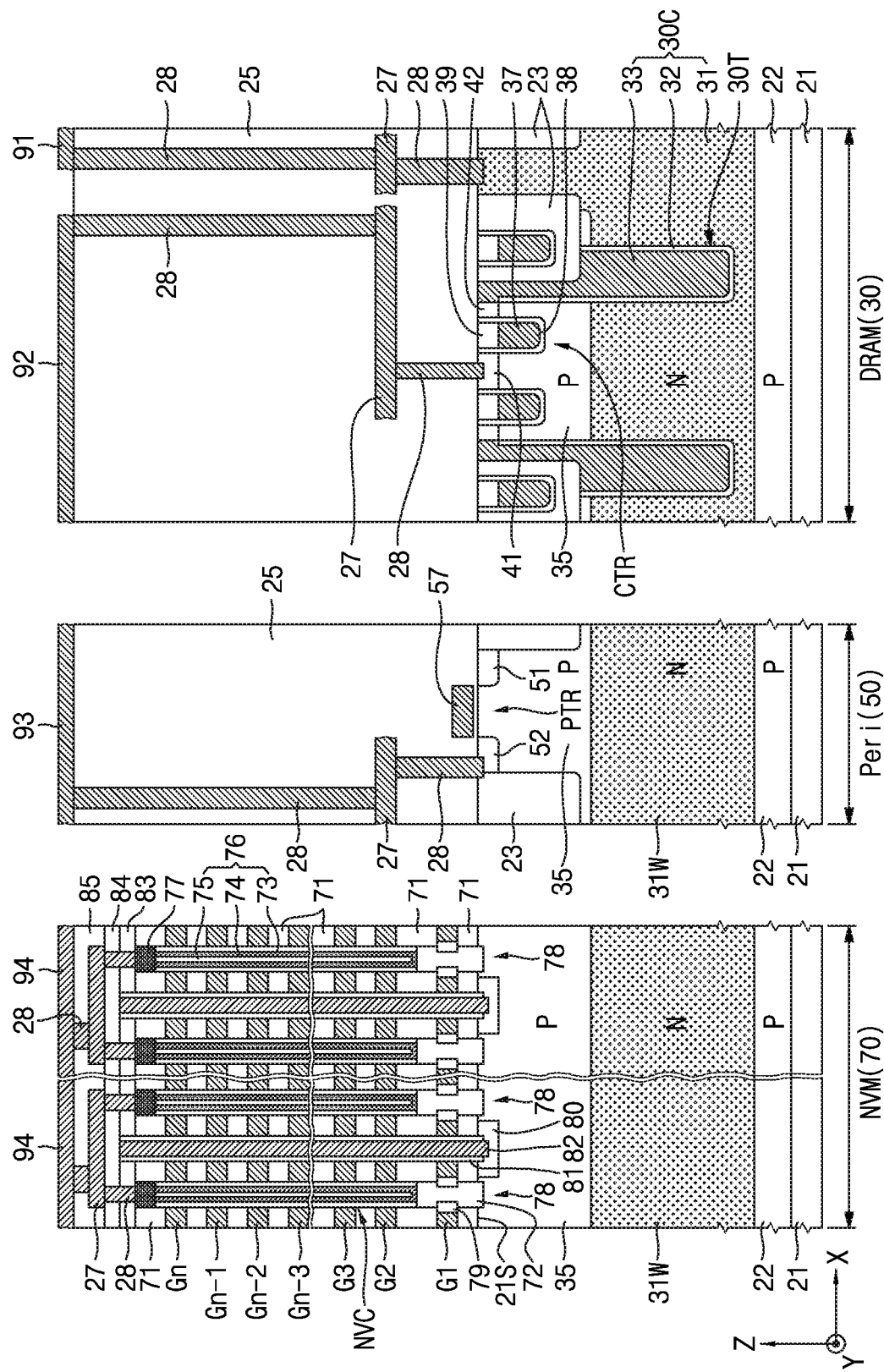

FIGS. 1 and 2 are sectional views for illustrating a semiconductor device according to an example embodiment of the present inventive concepts.

Referring to FIG. 1, the semiconductor device may include a volatile memory region 30, a peripheral circuit region 50, and a non-volatile memory region 70. In an example embodiment, the volatile memory region 30, the peripheral circuit region 50, and the non-volatile memory region 70 may be disposed side by side not to overlap with one another. The peripheral circuit region 50 may be disposed between the volatile memory region 30 and the non-volatile memory region 70. The volatile memory region 30 may include volatile memory cells such as a DRAM cell, an SRAM cell, or a combination thereof. The peripheral circuit region 50 may include logic circuits such as a controller, a system memory such as an SRAM cell, or a combination thereof. The peripheral circuit region 50 may be electrically connected to the volatile memory region 30 and the non-volatile memory region 70. The non-volatile memory region 70 may include non-volatile memory cells such as a flash memory cell, an MRAM cell, an RRAM cell, an FRAM cell, a polymer RAM cell, a PRAM cell, or a combination thereof. In an embodiment, the non-volatile memory region 70 may include a VNAND, a 3D non-volatile memory, an X-point memory, or a combination thereof.

In an example embodiment, the semiconductor device may include a substrate 21, a device isolation layer 23, an interlayer insulating layer 25, intermediate wires 27, contact plugs 28, a first electrode 31, a first capacitor dielectric layer 32, a second electrode 33, a first well 35, a cell gate electrode 37, a cell gate dielectric layer 38, a gate capping pattern 39, a cell source region 41, a cell drain region 42, a peripheral source region 51, a peripheral drain region 52, a peripheral gate electrode 57, a plurality of mold layers 71, a plurality of pillars 78, a plurality of non-volatile gate electrodes G1 to Gn, a selection gate dielectric layer 79, impurity regions 80, a spacer 81, source lines 82, a first upper insulating layer 83, a second upper insulating layer 84, a third upper insulating layer 85, and upper wires 91, 92, 93, and 94. Each of the plurality of pillars 78 may include a semiconductor pattern 72, a channel structure 76, and/or a conductive pad 77. The channel structure 76 may include an information storage pattern 73, a channel pattern 74, and a core pattern 75.

The first electrode 31, the first capacitor dielectric layer 32, the second electrode 33, the first well 35, the cell gate electrode 37, the cell gate dielectric layer 38, the gate capping pattern 39, the cell source region 41, and/or the cell drain region 42 may be formed in the volatile memory region 30. The first electrode 31, the first capacitor dielectric layer 32, and the second electrode 33 may constitute a first cell capacitor 30C. The first cell capacitor 30C may be formed in the substrate 21. The first cell capacitor 30C may be formed at a lower level than an upper surface of the substrate 21. The first capacitor dielectric layer 32 and the second electrode 33 may be formed in a capacitor trench 30T formed from the upper surface of the substrate 21 toward the inside of the substrate 21. The capacitor trench 30T may have a height greater than a horizontal width. A lower surface of the first electrode 31 may be formed at a lower level than the bottom of the capacitor trench 30T. The first electrode 31 and the second electrode 33 may face each other. The first capacitor dielectric layer 32 may be interposed between the first electrode 31 and the second electrode 33. The first cell capacitor 30C may be referred to as a trench capacitor.

The first well 35, the cell gate electrode 37, the cell gate dielectric layer 38, the cell source region 41, and the cell drain region 42 may constitute a cell transistor CTR. The cell transistor CTR may be formed in the substrate 21. The cell source region 41 and the cell drain region 42 may be spaced apart from each other. The cell gate electrode 37 may be disposed between the cell source region 41 and the cell drain region 42. An upper surface of the cell gate electrode 37 may be formed at a lower level than an upper end of the substrate 21. The cell transistor CTR may correspond to a recess channel transistor.

In an example embodiment, the cell transistor CTR may be formed inside the substrate 21 and/or on the substrate 21. The cell transistor CTR may include a finFET, a planar transistor, a vertical transistor, a nanowire transistor, a multi-bridge channel transistor, a 3D transistor, or a combination thereof.

The first electrode 31 may correspond to a plate node. The second electrode 33 may correspond to a storage node. The second electrode 33 may be connected to the cell drain region 42. The first cell capacitor 30C may be connected to the cell transistor CTR. The first cell capacitor 30C and the cell transistor CTR may constitute a DRAM cell. The first cell capacitor 30C and the cell transistor CTR may correspond to a volatile memory cell. In an example embodiment, the first cell capacitor 30C may be referred to as a cell capacitor. The first capacitor dielectric layer 32 may be referred to as a capacitor dielectric layer.

The peripheral source region 51, the peripheral drain region 52, and/or the peripheral gate electrode 57 may be formed in the peripheral circuit region 50. The peripheral source region 51, the peripheral drain region 52, and the peripheral gate electrode 57 may constitute a peripheral transistor PTR. The peripheral transistor PTR may be interpreted as a planar transistor. In an example embodiment, the peripheral transistor PTR may include a finFET, a recess channel transistor, a vertical transistor, a nanowire transistor, a multi-bridge transistor, a 3D transistor, or a combination thereof.

The plurality of mold layers 71, the plurality of pillars 78, the plurality of non-volatile gate electrodes G1 to Gn, the selection gate dielectric layer 79, the impurity regions 80, the spacer 81, and/or the source lines 82 may be formed in the non-volatile memory region 70. The plurality of mold layers 71 may be stacked alternately with the plurality of non-volatile gate electrodes G1 to Gn. A configuration of the plurality of mold layers 71 and the plurality of non-volatile gate electrodes G1 to Gn may be interpreted as insulating layers and electrodes being alternately and repeatedly stacked. The first non-volatile gate electrode G1 may correspond to a ground selection line (GSL). Each of the second to $(n-2)^{th}$ non-volatile gate electrodes G2 to Gn-2 may correspond to a control gate line. Each of the $(n-1)^{th}$ and $n^{th}$ non-volatile gate electrodes Gn-1 and Gn may correspond to a string selection line SSL or a drain selection line DSL. The impurity regions 80 may correspond to a common source region.

Each of the plurality of pillars 78 may be brought into contact with the substrate 21 through the plurality of mold layers 71 and the plurality of non-volatile gate electrodes G1 to Gn. The channel structure 76 may be formed on the semiconductor pattern 72. The conductive pad 77 may be formed on the channel structure 76. The second to $(n-2)^{th}$ non-volatile gate electrodes G2 to Gn-2 and the channel structure 76 may constitute a plurality of non-volatile memory cells NVC. The plurality of non-volatile memory cells NVC may be formed at a higher level than the upper surface of the substrate 21. The first upper insulating layer 83, the second upper insulating layer 84, and the third upper insulating layer 85 may be sequentially formed on the plurality of mold layers 71. The source lines 82 may be formed in contact with the impurity regions 80 through the first upper insulating layer 83, the plurality of mold layers 71, and the plurality of non-volatile gate electrodes G1 to Gn. The spacer 81 may surround side surfaces of the source lines 82. Each of the plurality of non-volatile memory cells NVC may correspond to a VNAND cell.

The interlayer insulating layer 25 may cover the volatile memory region 30 and the peripheral circuit region 50 of the substrate 21. The intermediate wires 27 and the contact plugs 28 may be formed in the interlayer insulating layer 25, the first upper insulating layer 83, the second upper insulating layer 84, and the third upper insulating layer 85. The upper wires 91, 92, 93, and 94 may include a first upper wire 91, a second upper wire 92, a third upper wire 93, and a fourth upper wire 94.

The first upper wire 91 may be connected to the first electrode 31 via the contact plugs 28 and the intermediate wires 27. The second upper wire 92 may be connected to the cell source region 41 via the contact plugs 28 and the intermediate wires 27. In an embodiment, the second upper wire 92 may be electrically connected to the fourth upper wire 94 via the third upper wire 93. The second upper wire 92 may correspond or connect to a bit line of a volatile memory. The third upper wire 93 may be connected to the peripheral drain region 52 via the contact plugs 28 and the intermediate wires 27. The fourth upper wire 94 may be connected to the conductive pad 77 via the contact plugs 28 and the intermediate wires 27. The fourth upper wire 94 may be electrically connected to the second upper wire 92 via the third upper wire 93. The fourth upper wire 94 may correspond to a bit line of a non-volatile memory.

The first cell capacitor 30C and the plurality of non-volatile memory cells NVC may be disposed at different levels and may be arranged not to overlap with one another in a horizontal and/or vertical direction. It is thus possible to implement a semiconductor device which is advantageous for higher-speed operation and easier to highly integrate.

Referring to FIG. 2, a plurality of wells 22, 31W, and 35 may be formed in the substrate 21. The plurality of wells 22, 31W, and 35 may include a first well 35, a second well 31W, and a third well 22. The second well 31W may contain impurities of a different conductivity type from those of the first well 35 and the third well 22. The peripheral source region 51 and the peripheral drain region 52 may be formed in the first well 35 of the peripheral circuit region 50. The impurity regions 80 may be formed in the first well 35 of the non-volatile memory region 70.

The third well 22 may be formed by implanting first conductive impurities into the substrate 21 in the volatile memory region 30, the peripheral circuit region 50, and the non-volatile memory region 70. The second well 31W may be formed by implanting second conductive impurities into the substrate 21 in the peripheral circuit region 50 and the non-volatile memory region 70. The first electrode 31 may be formed by implanting second conductive impurities into the substrate 21 in the volatile memory region 30. Simultaneously, the first electrode 31 may be formed using the same ion implantation process as that of the second well 31W. The lower surface of the first electrode 31 may be formed at substantially the same level as a lower surface of the second well 31W. The second well 31W and the first electrode 31 may be disposed on the third well 22.

The first well 35 may be formed by implanting first conductive impurities into the substrate 21 in the volatile memory region 30, the peripheral circuit region 50, and the non-volatile memory region 70. The first well 35 may be disposed on the second well 31W and the first electrode 31. The second well 31W and the first electrode 31 may be arranged between the third well 22 and the first well 35. The second conductive impurities may be different from the first conductive impurities. For example, the first conductive impurities may include P-type impurities, and the second conductive impurities may include N-type impurities.

In an example embodiment, the third well 22 may contain impurities of the same conductivity type as that of the substrate 21. The third well 22 may be omitted. An ion implantation process for forming the first electrode 31 may include an ion implantation process different from that for forming the second well 31W.

Figure 3:
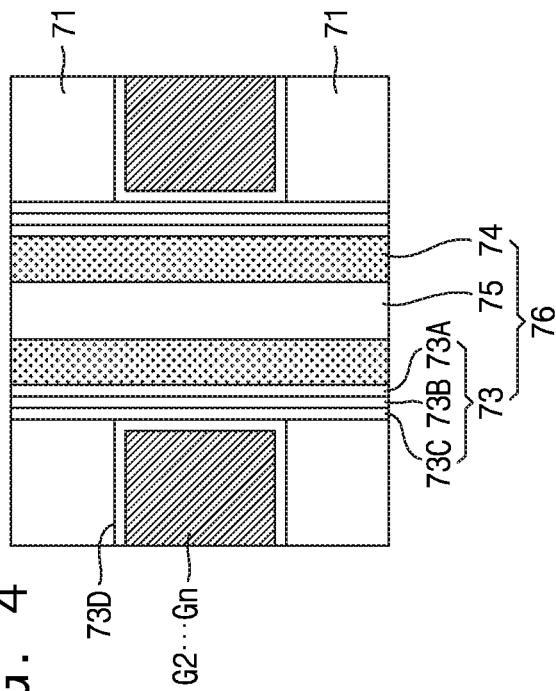
FIG. 3 is a partial sectional view for illustrating a semiconductor device according to an example embodiment of the present inventive concepts.

FIG. 3 is a partial sectional view for illustrating a semiconductor device according to an example embodiment of the present inventive concepts.

Referring to FIG. 3, the semiconductor device may include a trench spacer 30S, a first electrode 31, a first capacitor dielectric layer 32, and/or a second electrode 33. The first electrode 31 may include an inner electrode 31A and an outer electrode 31B. The capacitor trench 30T may penetrate into the third well 22 through the first well 35 and the outer electrode 31B. The trench spacer 30S may be formed on an upper side wall of the capacitor trench 30T. The inner electrode 31A may be formed on the side wall and the bottom of the capacitor trench 30T. The inner electrode 31A may be formed adjacent to the capacitor trench 30T. The first capacitor dielectric layer 32 and the second electrode 33 may be disposed in the capacitor trench 30T. The first electrode 31, the first capacitor dielectric layer 32, and the second electrode 33 may constitute the first cell capacitor 30C.

The inner electrode 31A may be formed at a lower level than the trench spacer 30S. The inner electrode 31A may surround a side surface and a lower surface of the second electrode 33. The first capacitor dielectric layer 32 may be interposed between the inner electrode 31A and the second electrode 33. A lowermost end of the second electrode 33 may be formed at a lower level than an uppermost end of the third well 22. A lowermost end of the inner electrode 31A may be formed at a lower level than the uppermost end of the third well 22. The outer electrode 31B may surround an outer surface of the inner electrode 31A. The outer electrode 31B may be in direct contact with the inner electrode 31A. The lowermost end of the inner electrode 31A may be formed at a lower level than a lower surface of the outer electrode 31B.

The trench spacer 30S may contain an insulating material such as a silicon oxide, a silicon nitride, a silicon oxynitride, a low-K dielectric material, a high-K dielectric material, or a combination thereof. The outer electrode 31B may be formed by implanting impurities of a different conductivity type from that of the third well 22. The inner electrode 31A may include a metal silicide layer, a metal layer, a conductive carbon layer, a semiconductor layer having impurities of the same conductivity type as that of the outer electrode 31B, or a combination thereof FIGS. 4 and 5 are enlarged partial views showing a portion of FIG. 1 in detail.

Figure 4:
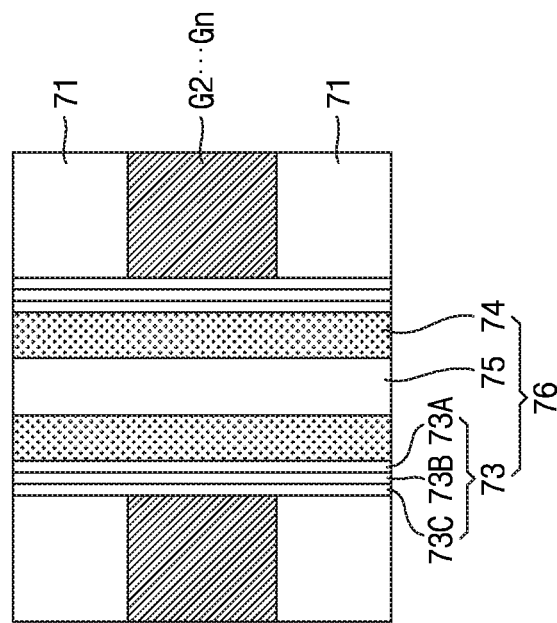
FIGS. 4 and 5 are enlarged partial views showing a portion of FIG. 1 in detail.

Referring to FIG. 4, the channel structure 76 may include a channel pattern 74 surrounding a core pattern 75 and an information storage pattern 73 disposed between the channel pattern 74 and second to $n^{th}$ non-volatile gate electrodes G2 to Gn. The information storage pattern 73 may include a tunnel insulating layer 73A, an electric charge storage layer 73B surrounding the outside of the tunnel insulating layer 73A, and a first blocking layer 73C surrounding the outside of the electric charge storage layer 73B. A second blocking layer 73D interposed between the first blocking layer 73C and the second to $n^{th}$ non-volatile gate electrodes G2 to Gn to cover upper surfaces and lower surfaces of the second to $n^{th}$ non-volatile gate electrodes G2 to Gn may be provided.

Figure 5:
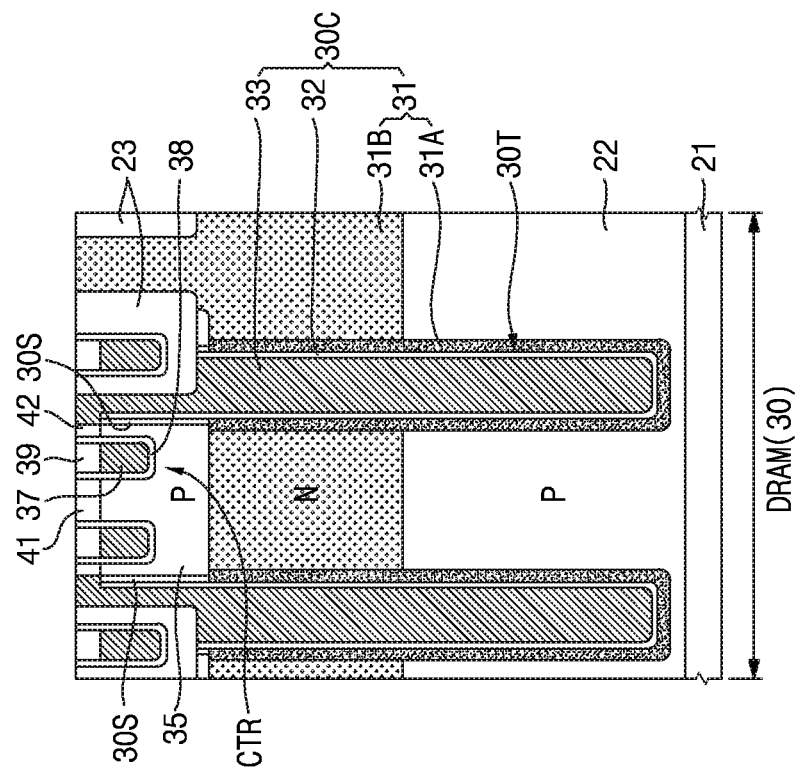

Referring to FIG. 5, the information storage pattern 73 may include a tunnel insulating layer 73A, an electric charge storage layer 73B surrounding the outside of the tunnel insulating layer 73A, and a first blocking layer 73C surrounding the outside of the electric charge storage layer 73B.

Figure 6:
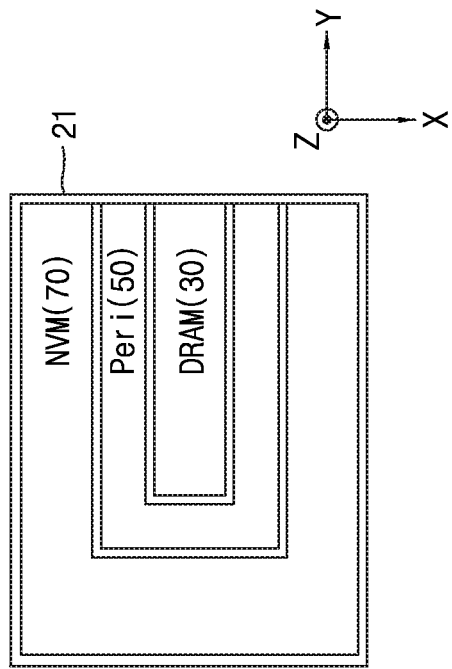
FIGS. 6 to 8 are layouts showing a configuration of a semiconductor device according to an example embodiment of the present inventive concepts.
Figure 7:
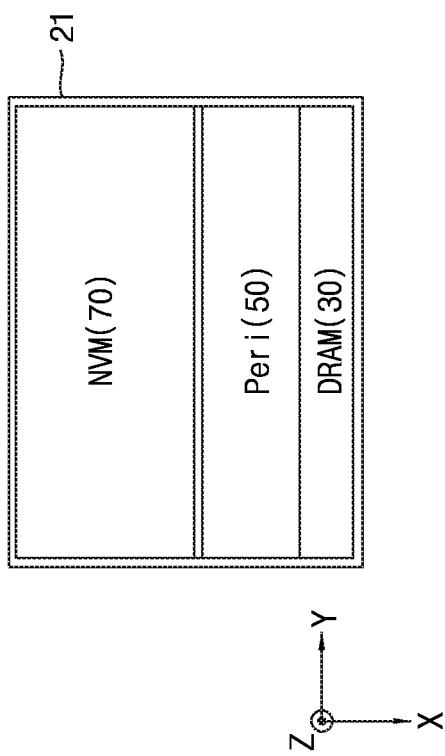
Figure 8:
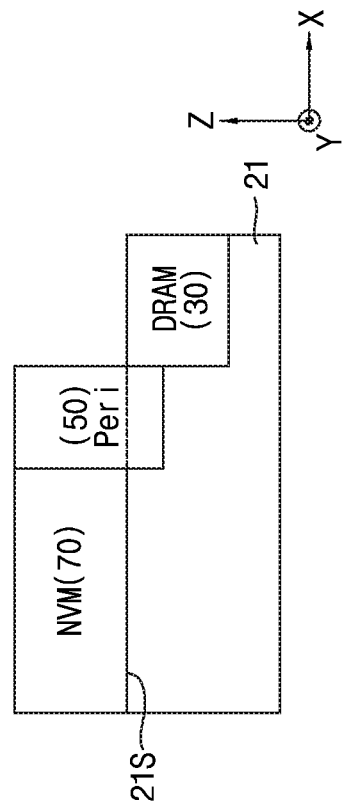

FIGS. 6 to 8 are layouts showing a configuration of a semiconductor device according to an example embodiment of the present inventive concepts. In an example embodiment, FIGS. 1 and 2 are sectional views showing portions of FIG. 6.

Referring to FIG. 6, the volatile memory region 30, the peripheral circuit region 50, and the non-volatile memory region 70 may be arranged adjacent to one another inside and/or on the substrate 21 in two dimensions. For example, the peripheral circuit region 50 may be disposed between the volatile memory region 30 and the non-volatile memory region 70. The volatile memory region 30, the peripheral circuit region 50, and the non-volatile memory region 70 may be disposed not to overlap with one another in a vertical direction. The volatile memory region 30, the peripheral circuit region 50, and the non-volatile memory region 70 may be disposed side by side. In an embodiment, the volatile memory region 30 may be disposed in a smaller area than the non-volatile memory region 70. The peripheral circuit region 50 may be disposed in a larger area than the volatile memory region 30 and in a smaller area than the non-volatile memory region 70.

Referring to FIG. 7, the non-volatile memory region 70 may be disposed to surround three surfaces of the volatile memory region 30. The peripheral circuit region 50 may be disposed between the volatile memory region 30 and the non-volatile memory region 70.

Referring to FIG. 8, the volatile memory region 30 may be disposed to surround two surfaces of the non-volatile memory region 70. The peripheral circuit region 50 may be disposed between the volatile memory region 30 and the non-volatile memory region 70.

Figure 9:
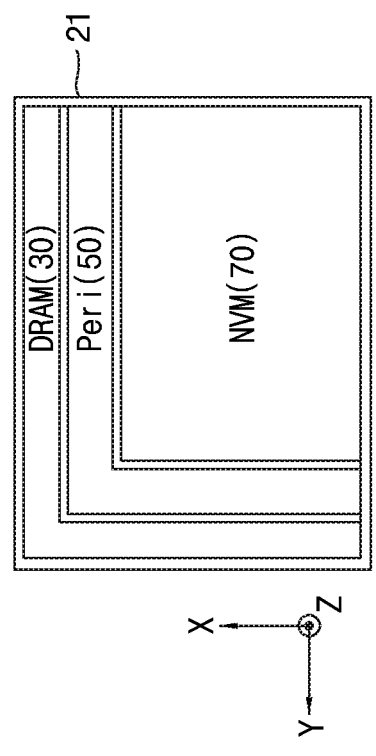
FIG. 9 is a sectional view showing a configuration of a semiconductor device according to an example embodiment of the present inventive concepts.

FIG. 9 is a sectional view showing a configuration of a semiconductor device according to an example embodiment of the present inventive concepts.

Referring to FIG. 9, the volatile memory region 30 may be disposed at a different level from that of the non-volatile memory region 70. In an example embodiment, a volatile memory cell in the volatile memory region 30 may be formed in the substrate 21. The volatile memory cell in the volatile memory region 30 may be formed at a lower level than an upper surface 21S of the substrate 21. A non-volatile memory cell in the non-volatile memory region 70 may be formed on the substrate 21. The non-volatile memory cell in the non-volatile memory region 70 may be formed at a higher level than the upper surface 21S of the substrate 21. The peripheral circuit region 50 may be disposed inside and/or on the substrate 21. The volatile memory region 30, the peripheral circuit region 50, and the non-volatile memory region 70 may be disposed not to overlap with one another.

In an example embodiment, the peripheral circuit region 50 may include a volatile memory controller and a non-volatile memory controller. For example, the volatile memory controller may include a DRAM controller, and the non-volatile memory controller may include a VNAND controller. In an example embodiment, the volatile memory controller and the non-volatile memory controller may be disposed outside the substrate 21 and may be electrically connected to the volatile memory region 30, the peripheral circuit region 50, and the non-volatile memory region 70.

FIG. 10 is a layout showing a configuration of a semiconductor device according to an example embodiment of the present inventive concepts.

Referring to FIG. 10, the volatile memory region 30 and the peripheral circuit region 50 may be arranged adjacent to each other inside and/or on the substrate 21 in two dimensions. The non-volatile memory region 70 may be disposed on the volatile memory region 30 and the peripheral circuit region 50 in an overlapping manner.

FIG. 11 is a sectional view showing a configuration of a semiconductor device according to an example embodiment of the present inventive concepts.

Referring to FIG. 11, the volatile memory region 30 and the peripheral circuit region 50 may be arranged adjacent to each other inside and/or on the substrate 21. The volatile memory cell in the volatile memory region 30 may be formed at a lower level than an upper surface 21S of the substrate 21. The peripheral circuit region 50 may be disposed inside and/or on the substrate 21. The non-volatile memory region 70 may be disposed on the volatile memory region 30 and the peripheral circuit region 50 in an overlapping manner. The non-volatile memory cell in the non-volatile memory region 70 may be disposed on the peripheral circuit region 50 and the volatile memory cell in the volatile memory region 30 in an overlapping manner.

In an example embodiment, the peripheral circuit region 50 may include a volatile memory controller and a non-volatile memory controller. For example, the volatile memory controller may include a DRAM controller, and the non-volatile memory controller may include a VNAND controller. In an example embodiment, the volatile memory controller and the non-volatile memory controller may be disposed outside the substrate 21 and may be electrically connected to the volatile memory region 30, the peripheral circuit region 50, and the non-volatile memory region 70.

FIGS. 12 to 15 are sectional views showing a portion of a semiconductor device according to an example embodiment of the present inventive concepts.

Referring to FIG. 12, the semiconductor device may include a volatile memory region 30, a peripheral circuit region 50, and a non-volatile memory region 70. The semiconductor device may include a substrate 21, a device isolation layer 23, a first interlayer insulating layer 25A, a second interlayer insulating layer 25B, a third interlayer insulating layer 25C, intermediate wires 27, contact plugs 28, a first electrode 31, a first capacitor dielectric layer 32, a second electrode 33, a first well 35, a cell gate electrode 37, a cell gate dielectric layer 38, a gate capping pattern 39, a cell source region 41, a cell drain region 42, a peripheral source region 51, a peripheral drain region 52, a peripheral gate electrode 57, a plurality of mold layers 71, a plurality of pillars 78, a plurality of non-volatile gate electrodes G1 to Gn, impurity regions 80, a source pattern 80S, a spacer 81, source lines 82, a first upper insulating layer 83, a second upper insulating layer 84, a third upper insulating layer 85, and/or upper wires 91, 92, 93, and 94. Each of the pillars 78 may include a channel structure 76 and a conductive pad 77. The channel structure 76 may include an information storage pattern 73, a channel pattern 74, and a core pattern 75.

The first interlayer insulating layer 25A may cover the volatile memory region 30 and the peripheral circuit region 50 of the substrate 21. The second interlayer insulating layer 25B may be formed on the first interlayer insulating layer 25A. The source pattern 80S may be formed on the second interlayer insulating layer 25B. The source pattern 80S may contain a conductive material such as polysilicon, a metal, a metal oxide, a metal nitride, a metal silicide, conductive carbon, or a combination thereof. The plurality of mold layers 71 and the plurality of non-volatile gate electrodes G1 to Gn may be alternately and repeatedly stacked on the source pattern 80S. The channel structure 76 may pass through the plurality of mold layers 71 and the plurality of non-volatile gate electrodes G1 to Gn. The channel pattern 74 may be in direct contact with the source pattern 80S.

The impurity regions 80 may be formed in the source pattern 80S. The impurity regions 80 and the source pattern 80S may correspond to a common source region. The impurity regions 80 may be omitted. The source lines 82 may be in direct contact with the source pattern 80S.

The first cell capacitor 30C and the cell transistor CTR may constitute a volatile memory cell. The non-volatile memory region 70 may overlap with the volatile memory region 30 and the peripheral circuit region 50. Non-volatile memory cells in the non-volatile memory region 70 may be disposed on a volatile memory cell in the volatile memory region 30 and on a peripheral transistor PTR in the peripheral circuit region 50 in an overlapping manner.

Figure 13:
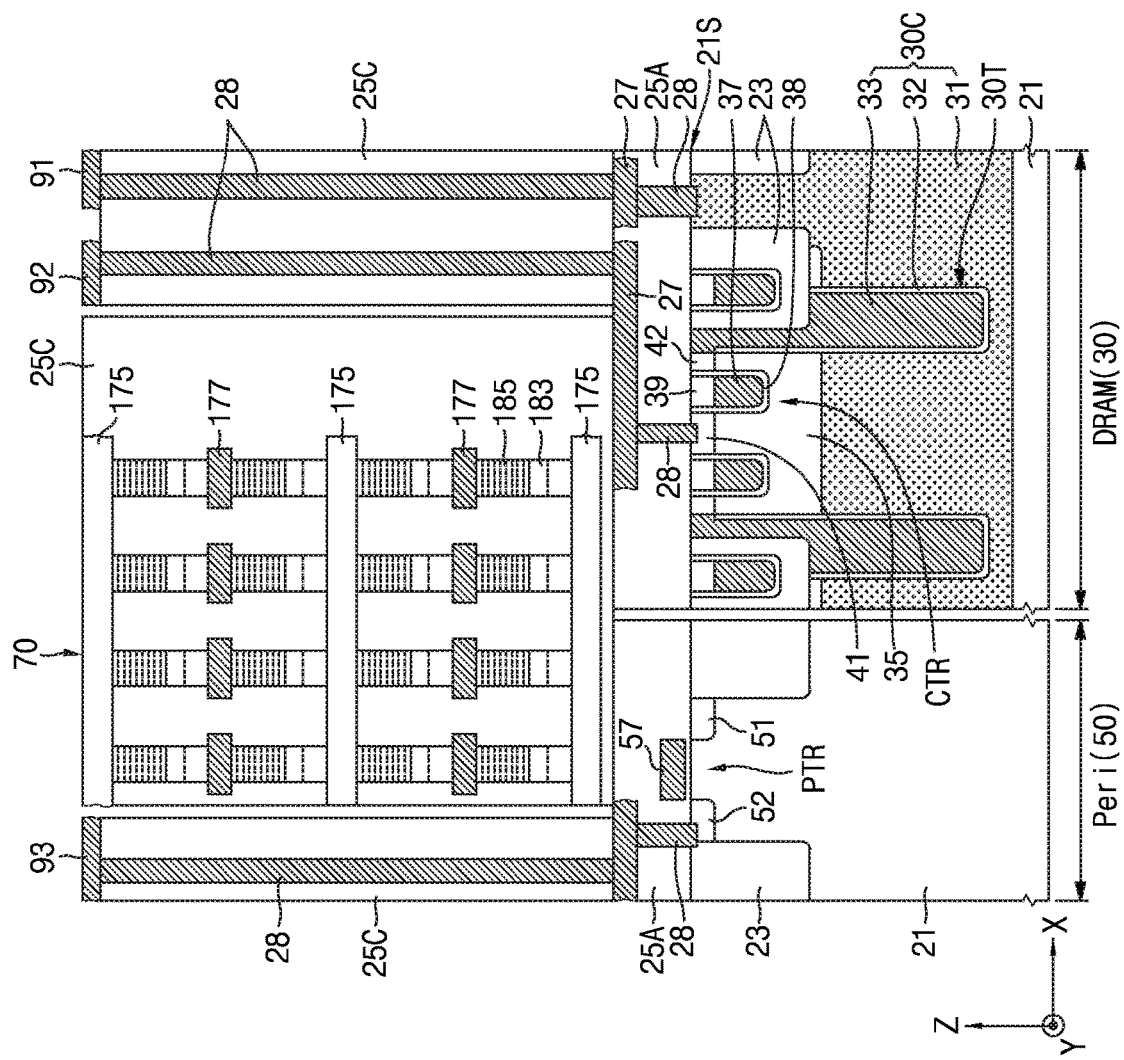

Referring to FIG. 13, the semiconductor device may include a volatile memory region 30, a peripheral circuit region 50, and a non-volatile memory region 70. The semiconductor device may include a substrate 21, a device isolation layer 23, a first interlayer insulating layer 25A, a third interlayer insulating layer 25C, intermediate wires 27, contact plugs 28, a first electrode 31, a first capacitor dielectric layer 32, a second electrode 33, a first well 35, a cell gate electrode 37, a cell gate dielectric layer 38, a gate capping pattern 39, a cell source region 41, a cell drain region 42, a peripheral source region 51, a peripheral drain region 52, a peripheral gate electrode 57, a plurality of first wires 175, a plurality of second wires 177, a plurality of switching devices 183, a plurality of non-volatile memory cells 185, and/or upper wires 91, 92, and 93.

The non-volatile memory region 70 may be disposed on the volatile memory region 30 and the peripheral circuit region 50 in an overlapping manner. Non-volatile memory cells 185 in the non-volatile memory region 70 may be disposed on a volatile memory cell in the volatile memory region 30 and on a peripheral transistor PTR in the peripheral circuit region 50 in an overlapping manner. The plurality of first wires 175, the plurality of second wires 177, the plurality of switching devices 183, and the plurality of non-volatile memory cells 185 may be formed in the non-volatile memory region 70. The plurality of first wires 175, the plurality of second wires 177, the plurality of switching devices 183, and the plurality of non-volatile memory cells 185 may be repeatedly formed in the non-volatile memory region 70 on the first interlayer insulating layer 25A to have a multi-layer structure.

The plurality of first wires 175 may be disposed parallel to one another. The plurality of second wires 177 may be disposed on the plurality of first wires 175 to intersect the plurality of first wires 175. The plurality of second wires 177 may be disposed parallel to one another. The plurality of switching devices 183 and the plurality of non-volatile memory cells 185 may be formed at intersections of the plurality of first wires 175 and the plurality of second wires 177. Each of the plurality of non-volatile memory cells 185 may be connected in series to a corresponding one of the plurality of switching devices 183. In an example embodiment, each of the plurality of switching devices 183 may include a diode such as a PN diode. Each of the plurality of non-volatile memory cells 185 may include an MRAM cell, an RRAM cell, an FRAM cell, a polymer RAM cell, a PRAM cell, or a combination thereof. For example, each of the plurality of non-volatile memory cells 185 may include a magnetic tunnel junction (MTJ) or a GeSbTe (GST) pattern.

Figure 14:
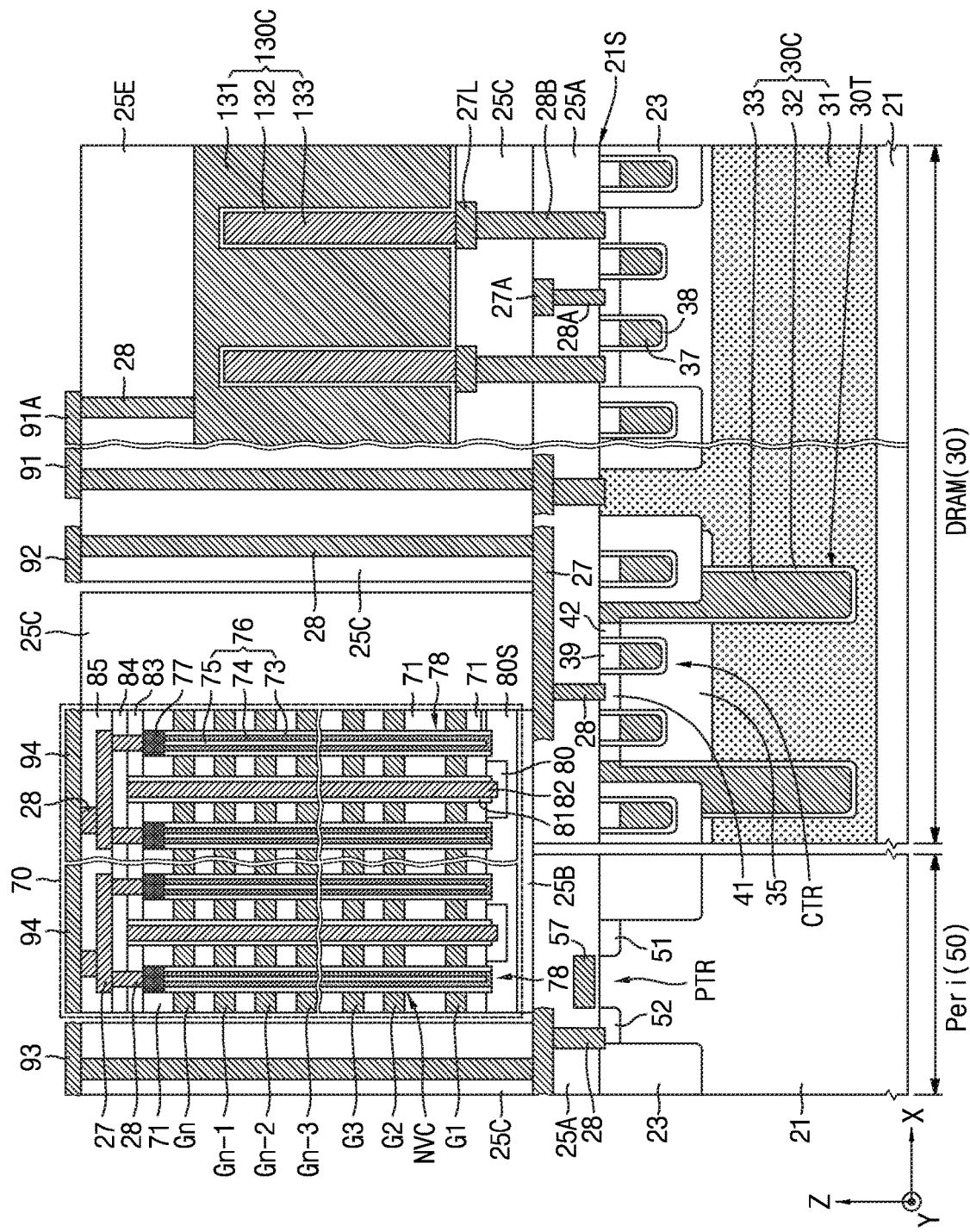

Referring to FIG. 14, the semiconductor device may include a substrate 21, a device isolation layer 23, a first interlayer insulating layer 25A, a second interlayer insulating layer 25B, a third interlayer insulating layer 25C, a fifth interlayer insulating layer 25E, intermediate wires 27, 27A, and 27L, contact plugs 28, 28A, 28B, a first electrode 31, a first capacitor dielectric layer 32, a second electrode 33, a first well 35, a cell gate electrode 37, a cell gate dielectric layer 38, a gate capping pattern 39, cell source regions 41, cell drain regions 42, a peripheral source region 51, a peripheral drain region 52, a peripheral gate electrode 57, a plurality of mold layers 71, a plurality of pillars 78, a plurality of non-volatile gate electrodes G1 to Gn, impurity regions 80, a source pattern 80S, a spacer 81, source lines 82, a first upper insulating layer 83, a second upper insulating layer 84, a third upper insulating layer 85, upper wires 91, 92, 93, and 94, a third electrode 131, a second capacitor dielectric layer 132, and/or a fourth electrode 133.

The first interlayer insulating layer 25A may cover a first cell capacitor 30C and a cell transistor CTR. The third interlayer insulating layer 25C may be formed on the first interlayer insulating layer 25A of the volatile memory region 30. The contact plugs 28, 28A, and 28B may include a bit plug 28A and a buried contact plug 28B. The intermediate wires 27, 27A, and 27L may include a bit line 27A and a landing pad 27L. The bit line 27A and the bit plug 28A may be disposed in the first interlayer insulating layer 25A. The landing pad 27L and the buried contact plug 28B may be disposed in the third interlayer insulating layer 25C. The buried contact plug 28B may be connected to one selected from among the cell drain regions 42 through the third interlayer insulating layer 25C and the first interlayer insulating layer 25A.

The fourth electrode 133 may be formed on the landing pad 27L. The second capacitor dielectric layer 132 and the third electrode 131 may be sequentially formed on the fourth electrode 133. The fourth electrode 133, the second capacitor dielectric layer 132, and the third electrode 131 may constitute a second cell capacitor 130C. The fifth interlayer insulating layer 25E may be formed on the second cell capacitor 130C. The second cell capacitor 130C may be disposed at the same level as the non-volatile memory cells NVC.

In an example embodiment, the fourth electrode 133 may include a pillar shape, a cylinder shape, an "L" shape, or a combination thereof.

Figure 15:
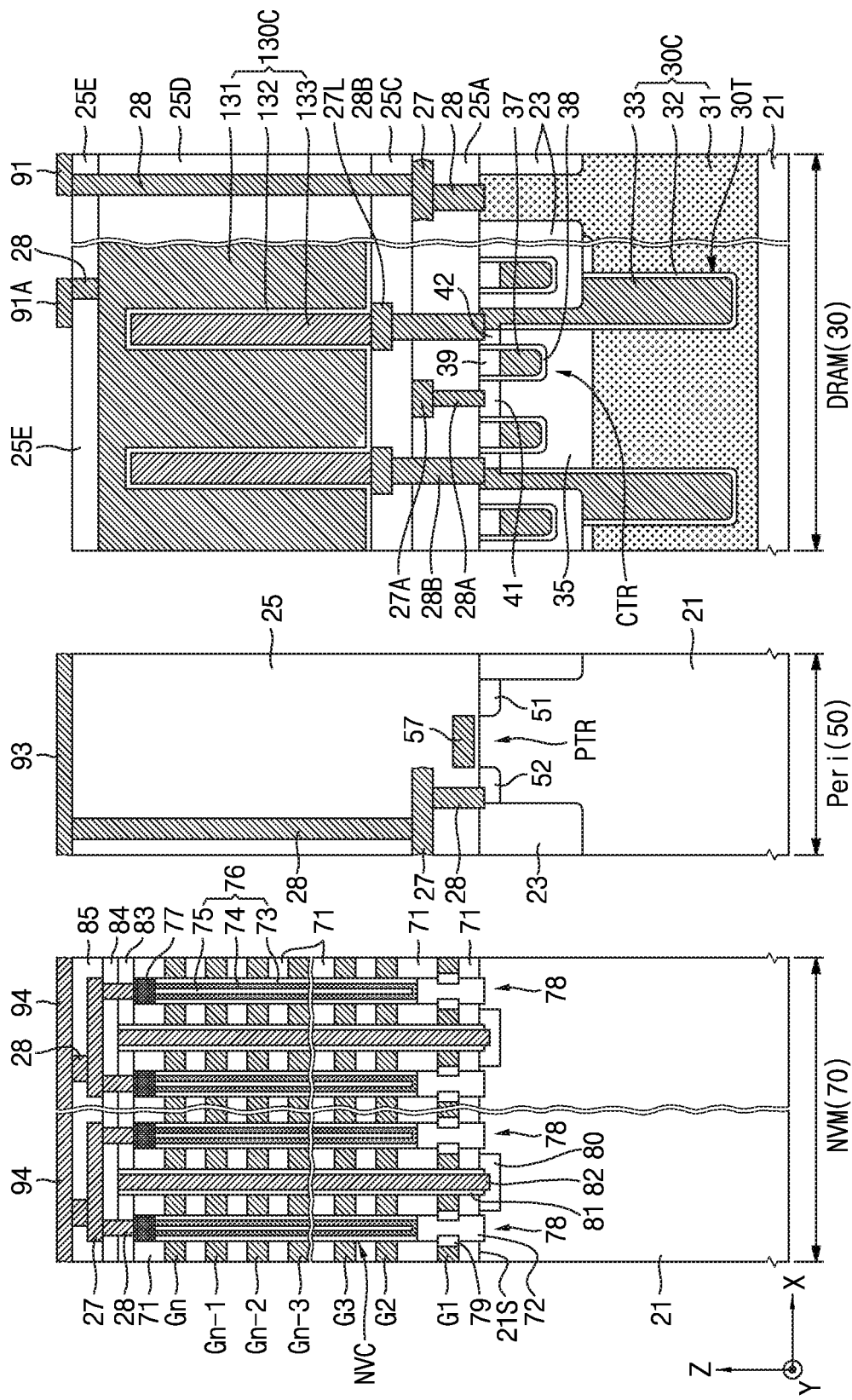

Referring to FIG. 15, a device isolation layer 23, a first electrode 31, a first capacitor dielectric layer 32, a second electrode 33, a first well 35, a cell gate electrode 37, a cell gate dielectric layer 38, a gate capping pattern 39, a cell source region 41, and/or cell drain regions 42 may be disposed in a substrate 21 of a volatile memory region 30. The first interlayer insulating layer 25A may cover a first cell capacitor 30C and a cell transistor CTR. A third interlayer insulating layer 25C may be formed on the first interlayer insulating layer 25A. The bit line 27A and the bit plug 28A may be disposed in the first interlayer insulating layer 25A. The landing pad 27L and the buried contact plug 28B may be disposed in the third interlayer insulating layer 25C. The buried contact plug 28B may be connected to the second electrode 33 and also one selected from among the cell drain regions 42 through the third interlayer insulating layer 25C and the first interlayer insulating layer 25A.

The fourth electrode 133 may be formed on the landing pad 27L. The second capacitor dielectric layer 132 and the third electrode 131 may be sequentially formed on the fourth electrode 133. The fourth electrode 133, the second capacitor dielectric layer 132, and the third electrode 131 may constitute the second cell capacitor 130C. The second cell capacitor 130C may be formed in a fourth interlayer insulating layer 25D on the third interlayer insulating layer 25C. A fifth interlayer insulating layer 25E may be formed on the fourth interlayer insulating layer 25D. The fifth interlayer insulating layer 25E may cover the second cell capacitor 130C. The second cell capacitor 130C may be disposed at the same level as the non-volatile memory cells NVC.

The fourth electrode 133 may be connected to the second electrode 33 and one selected from among the cell drain regions 42. The second cell capacitor 130C, the first cell capacitor 30C, and the cell transistor CTR may constitute a DRAM cell. The first cell capacitor 30C, the second cell capacitor 130C, and the cell transistor CTR may correspond to a volatile memory cell.

Figure 16:
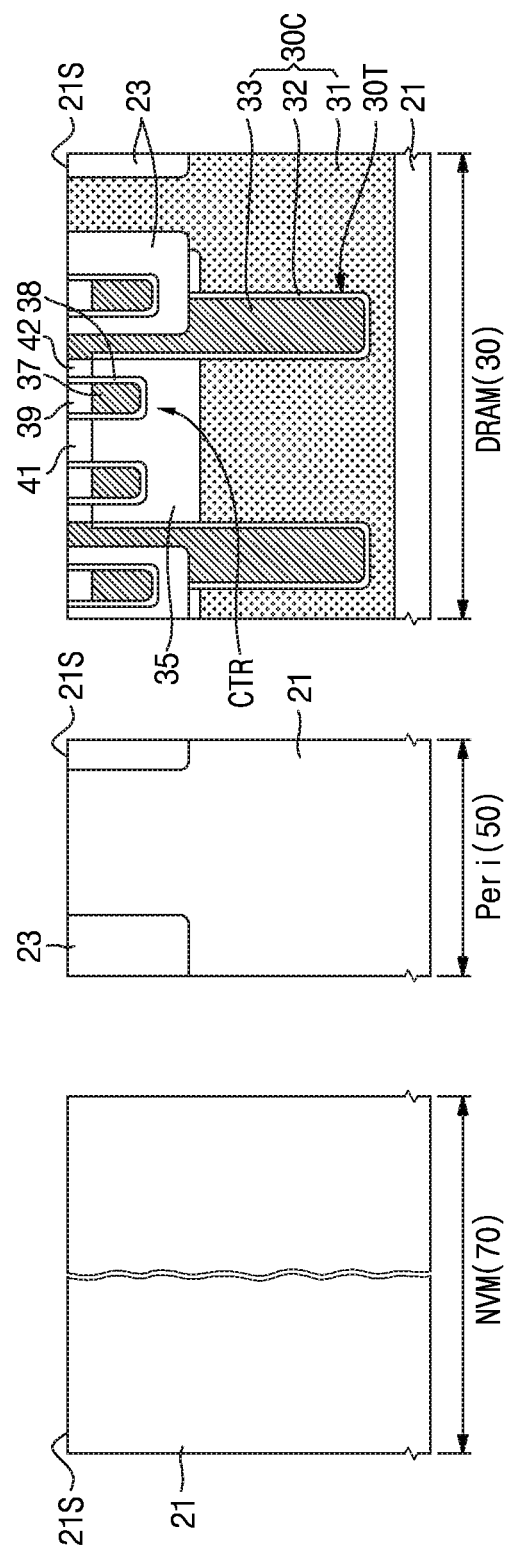
FIGS. 16 and 17 are sectional views for describing a method of forming a semiconductor device according to an example embodiment of the present inventive concepts.
Figure 17:
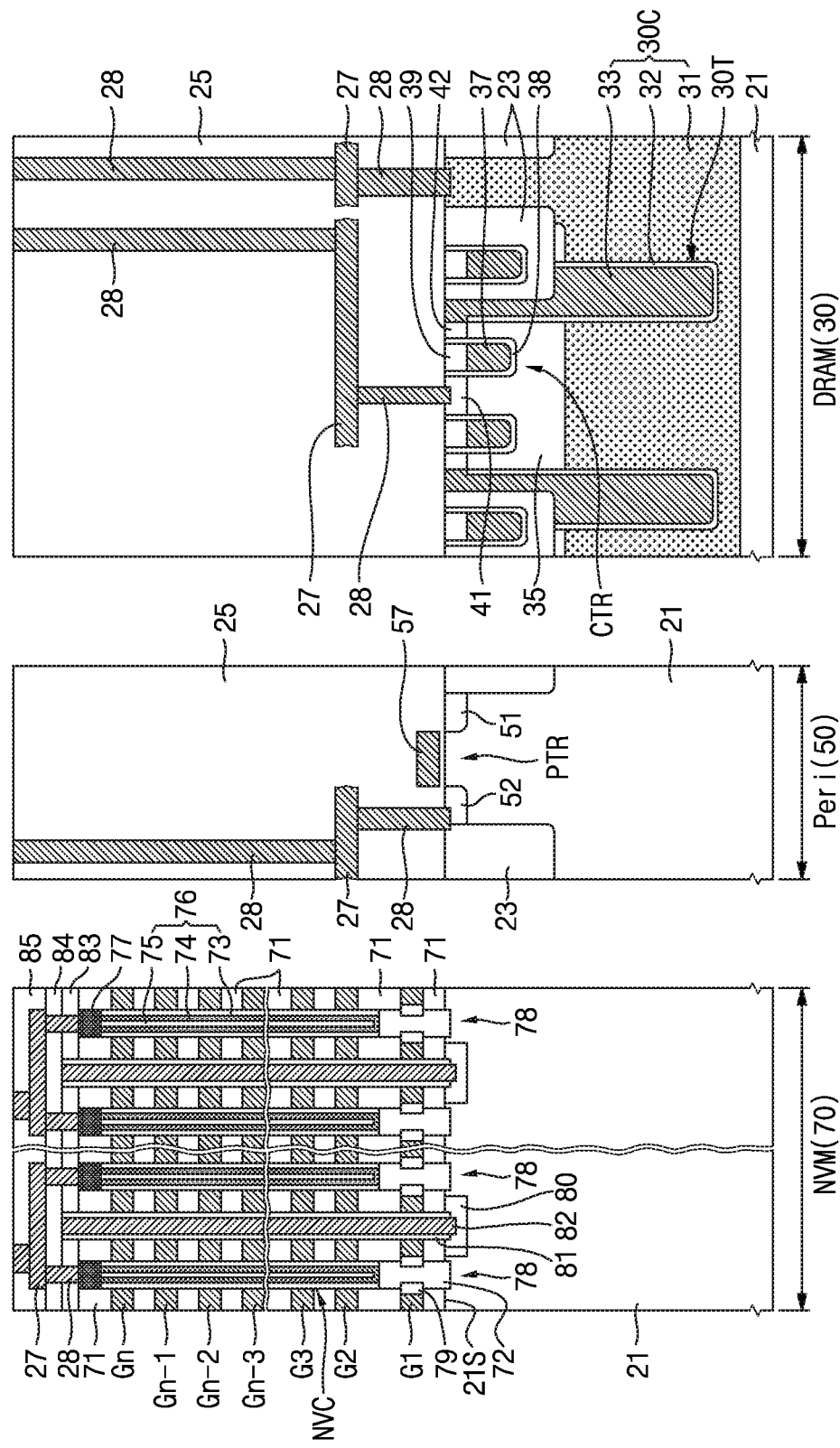

FIGS. 16 and 17 are sectional views for illustrating a method of forming a semiconductor device according to an example embodiment of the present inventive concepts.

Referring to FIG. 16, a device isolation layer 23, a first electrode 31, a first capacitor dielectric layer 32, a second electrode 33, a first well 35, a cell gate electrode 37, a cell gate dielectric layer 38, a gate capping pattern 39, a cell source region 41, and/or cell drain regions 42 may be formed in a substrate 21 having a volatile memory region 30, a peripheral circuit region 50, and/or a non-volatile memory region 70.

The substrate 21 may include a semiconductor substrate such as a silicon wafer or a silicon-on-insulator (SOI) wafer. For example, the substrate 21 may be a single crystal silicon wafer containing P-type impurities such as boron (B). The device isolation layer 23 may be formed in the substrate 21 by using a trench isolation method. A lower surface of the device isolation layer 23 may be formed at a lower level than an upper end of the substrate 21. The device isolation layer 23 may contain an insulating material such as a silicon oxide, a silicon nitride, a silicon oxynitride, a low-K dielectric material, or a combination thereof.

The first electrode 31 may be formed in the substrate 21. In an example embodiment, the first electrode 31 may be formed by implanting impurities of a different conductivity type from that of the substrate 21 into the substrate 21. For example, the substrate 21 may contain P-type impurities, and the first electrode 31 may contain N-type impurities such as phosphorus (P) or arsenic (As). A lower surface of the first electrode 31 may be formed at a lower level than a lower surface of the device isolation layer 23. A portion of the first electrode 31 may be exposed at the same level as upper ends of the device isolation layer 23 and the substrate 21. In an embodiment, the first electrode 31 may contain a metal silicide.

A capacitor trench 30T passing through the first well 35 and the first electrode 31 may be formed. In an embodiment, the capacitor trench 30T may completely pass through the first well 35 and may partially pass through the first electrode 31. The first capacitor dielectric layer 32 may be formed on the bottom and a side wall of the capacitor trench 30T. The capacitor dielectric layer 32 may be in direct contact with the first electrode 31 and the first well 35. The capacitor dielectric layer 32 may contain an insulating material such as a silicon oxide, a silicon nitride, a silicon oxynitride, a high-K dielectric material, or a combination thereof.

The first capacitor dielectric layer 32 and the second electrode 33 may be formed in the capacitor trench 30T. The second electrode 33 may fill the capacitor trench 30T. The first capacitor dielectric layer 32 may be interposed between the first electrode 31 and the second electrode 33. The second electrode 33 may be in contact with the cell drain region 42. A lower end of the second electrode 33 may be formed at a lower level than an upper surface of the first electrode 31. The lower end of the second electrode 33 may be formed at a lower level than a lower surface of the first well 35 and a lower surface of the device isolation layer 23. The second electrode 33 may contain a conductive material such as polysilicon, a metal, a metal oxide, a metal nitride, a metal silicide, conductive carbon, or a combination thereof.

The first well 35 may be formed in the substrate 21 on the first electrode 31. The first well 35 may contain impurities of a different conductivity type from that of the first electrode 31. The first well 35 may contain impurities of the same conductivity type as that of the substrate 21. The cell gate electrode 37 may be formed in the substrate 21. The cell gate electrode 37 may be formed in the first well 35. An upper surface of the cell gate electrode 37 may be formed at a lower level than an upper end of the substrate 21. The cell gate electrode 37 may contain a conductive material such as a metal, a metal oxide, a metal nitride, a metal silicide, polysilicon, conductive carbon, or a combination thereof. The cell gate dielectric layer 38 may be formed between the cell gate electrode 37 and the first well 35. The cell gate dielectric layer 38 may contain an insulating material such as a silicon oxide, a silicon nitride, a silicon oxynitride, a high-K dielectric material, or a combination thereof. The gate capping pattern 39 may cover the cell gate electrode 37. The gate capping pattern 39 may contain an insulating material such as a silicon oxide, a silicon nitride, a silicon oxynitride, a low-K dielectric material, or a combination thereof.

The cell source region 41 and the cell drain region 42 may be formed in the first well 35, which is adjacent to the cell gate electrode 37. The cell source region 41 and the cell drain region 42 may contain impurities of a different conductivity type from that of the first well 35. For example, the cell source region 41 and the cell drain region 42 may contain N-type impurities. A lower end of the cell source region 41 and a lower end of the cell drain region 42 may be formed at a higher level than a lower end of the cell gate electrode 37. An upper end of the cell source region 41 and an upper end of the cell drain region 42 may be formed at a higher level than an upper end of the cell gate electrode 37. The cell drain region 42 may be connected to the second electrode 33.

In an example embodiment, upper ends of the substrate 21, the device isolation layer 23, the second electrode 33, the gate capping pattern 39, the cell source region 41, and the cell drain region 42 may be exposed on substantially the same plane.

Referring to FIG. 17, an interlayer insulating layer 25, intermediate wires 27, contact plugs 28, a peripheral source region 51, a peripheral drain region 52, a peripheral gate electrode 57, a plurality of mold layers 71, a plurality of pillars 78, a plurality of non-volatile gate electrodes G1 to Gn, a selection gate dielectric layer 79, impurity regions 80, a spacer 81, source lines 82, a first upper insulating layer 83, a second upper insulating layer 84, and a third upper insulating layer 85 may be formed on the substrate 21. Each of the plurality of pillars 78 may include a semiconductor pattern 72, a channel structure 76, and a conductive pad 77. The channel structure 76 may include an information storage pattern 73, a channel pattern 74, and/or a core pattern 75.

The peripheral gate electrode 57 may be formed on the substrate 21 in the peripheral circuit region 50. The peripheral gate electrode 57 may contain a conductive material such as a metal, a metal oxide, a metal nitride, a metal silicide, polysilicon, conductive carbon, or a combination thereof. The peripheral source region 51 and the peripheral drain region 52 may be formed in the substrate 21 in the peripheral circuit region 50. The peripheral source region 51 and the peripheral drain region 52 may be formed adjacent to each other at both sides of the peripheral gate electrode 57. The peripheral source region 51 and the peripheral drain region 52 may contain impurities of a different conductivity type from that of the substrate 21.

The plurality of non-volatile gate electrodes G1 to Gn may be sequentially stacked on the substrate 21 in the non-volatile memory region 70. The plurality of mold layers 71 may be formed between the first non-volatile gate electrode G1 and the substrate 21, between the first to $n^{th}$ non-volatile gate electrodes G1 to Gn, and on the $n^{th}$ non-volatile gate electrode Gn. Each of the plurality of non-volatile gate electrodes G1 to Gn may contain a conductive material such as a metal, a metal oxide, a metal nitride, a metal silicide, polysilicon, conductive carbon, or a combination thereof. The plurality of mold layers 71 may contain an insulating material such as a silicon oxide, a silicon nitride, a silicon oxynitride, a silicon oxycarbonitride (SiOCN), a low-K dielectric material, or a combination thereof.

Each of the plurality of pillars 78 may be connected to the substrate 21 through the plurality of mold layers 71 and the plurality of non-volatile gate electrodes G1 to Gn. The semiconductor pattern 72 may be disposed on and in direct contact with the substrate 21. The semiconductor pattern 72 may be formed by using a selective epitaxial growth (SEG) process. In an embodiment, the semiconductor pattern 72 may contain single crystal silicon having P-type impurities. An upper end of the semiconductor pattern 72 may be formed between the first non-volatile gate electrode G1 and the second non-volatile gate electrode G2. The selection gate dielectric layer 79 may be formed between the semiconductor pattern 72 and the first non-volatile gate electrode G1. The selection gate dielectric layer 79 may contain an insulating material such as a silicon oxide, a silicon nitride, a silicon oxynitride, a high-K dielectric material, or a combination thereof.

The channel structure 76 may be formed on the semiconductor pattern 72. The core pattern 75 may contain an insulating material such as a silicon oxide, a silicon nitride, a silicon oxynitride, or a combination thereof. In an embodiment, the core pattern 75 may contain polysilicon. The channel pattern 74 may surround a side surface and a lower portion of the core pattern 75. The channel pattern 74 may include a semiconductor layer such as a polysilicon layer. The channel pattern 74 may be in direct contact with the semiconductor pattern 72. The information storage pattern 73 may be formed to surround an outside of the channel pattern 74.

In an example embodiment, as shown in FIGS. 4 and 5, the information storage pattern 73 may include a tunnel insulating layer 73A, an electric charge storage layer 73B surrounding the outside of the tunnel insulating layer 73A, and a first blocking layer 73C surrounding the outside of the electric charge storage layer 73B. The information storage pattern 73 may include a plurality of insulating layers such as a silicon oxide, a silicon nitride, a silicon oxynitride, a high-K dielectric material, or a combination thereof. In an example embodiment, the tunnel insulating layer 73A may contain a silicon oxide, the electric charge storage layer 73B may contain a silicon nitride, and the first blocking layer 73C may contain an aluminum oxide (AlO).

In an example embodiment, as shown in FIG. 4, a second blocking layer 73D may be formed. The second blocking layer 73D may be interposed between the first blocking layer 73C and the second to $n^{th}$ non-volatile gate electrodes G2 to Gn to cover upper surfaces and lower surfaces of the second to $n^{th}$ non-volatile gate electrodes G2 to Gn. The second blocking layer 73D may contain an insulating material such as a silicon oxide, a silicon nitride, a silicon oxynitride, a high-K dielectric material, or a combination thereof.

The conductive pad 77 may be formed on the channel structure 76. A lower end of the conductive pad 77 may be formed at a higher level than an upper end of the $n^{th}$ non-volatile gate electrode Gn. The conductive pad 77 may be in direct contact with the channel pattern 74. The conductive pad 77 may contain a conductive material such as polysilicon, a metal, a metal oxide, a metal nitride, a metal silicide, conductive carbon, or a combination thereof. The first upper insulating layer 83 may cover the pillars 78 and the mold layers 71.

The impurity regions 80 may be formed in the substrate 21 between the pillars 78. The impurity regions 80 may contain impurities of a different conductivity type from that of the substrate 21. For example, the impurity regions 80 may contain N-type impurities such as phosphorus (P) or arsenic (As).

The source lines 82 may be brought into contact with the impurity regions 80 through the first upper insulating layer 83, the mold layers 71, and the non-volatile gate electrodes G1 to Gn. The spacer 81 may surround side surfaces of the source lines 82. The source lines 82 may contain a conductive material such as a metal, a metal silicide, a metal oxide, a metal nitride, polysilicon, conductive carbon, or a combination thereof. The spacer 81 may include an insulating material such as a silicon oxide, a silicon nitride, a silicon oxynitride, a high-K dielectric material, a low-K dielectric material, or a combination thereof.

The second upper insulating layer 84 and the third upper insulating layer 85 may be sequentially formed on the first upper insulating layer 83. The interlayer insulating layer 25 may cover the volatile memory region 30 and the peripheral circuit region 50 of the substrate 21. The intermediate wires 27 and the contact plugs 28 may be formed in the interlayer insulating layer 25, the first upper insulating layer 83, the second upper insulating layer 84, and the third upper insulating layer 85. The interlayer insulating layer 25, the first upper insulating layer 83, the second upper insulating layer 84, and the third upper insulating layer 85 may contain an insulating material such as a silicon oxide, a silicon nitride, a silicon oxynitride, a silicon oxycarbonitride (SiOCN), a low-K dielectric material, or a combination thereof. The intermediate wires 27 and the contact plugs 28 may contain a conductive material such as a metal, a metal silicide, a metal oxide, a metal nitride, polysilicon, conductive carbon, or a combination thereof.

Referring to FIG. 1 again, the upper wires 91, 92, 93, and 94 may be formed on the interlayer insulating layer 25 and the third upper insulating layer 85. The upper wires 91, 92, 93, and 94 may contain a conductive material such as a metal, a metal silicide, a metal oxide, a metal nitride, polysilicon, conductive carbon, or a combination thereof.

Mass storage devices using a non-volatile memory such as a VNAND have been developed. Mass storage devices require a buffer memory having a higher operation speed than the non-volatile memory in order to improve a response speed. A DRAM, which is advantageous in terms of a low cost per bit and a relatively high operation speed, is widely used in buffer memories. For example, a storage device such as an SSD includes a plurality of VNAND chips, a controller chip, and a DRAM chip mounted on a printed circuit board (PCB). Externally input data may be temporarily stored in the DRAM chip via the controller chip, and the data temporarily stored in the DRAM chip may be recorded in the plurality of VNAND chips. A technique using a PCB is relatively disadvantageous in terms of operation speed and has limitations in lightening, thinning, shortening, and minimizing a storage device.

According to example embodiments of the present inventive concepts, a volatile memory cell having a trench capacitor formed at a lower level than an upper surface of a substrate and a non-volatile memory cell formed at a higher level than the upper surface of the substrate are provided. A process of forming the trench capacitor and a process of forming the non-volatile memory cell may be sequentially performed. Different types of memory cells may be efficiently formed in a single substrate. The volatile memory cell and the non-volatile memory cell may be connected to each other via a peripheral circuit region. A signal transfer path between the volatile memory cell and the non-volatile memory cell may be reduced or minimized. It is possible to implement a semiconductor device which is advantageous for higher integration and/or faster operation.

While example embodiments of the present inventive concepts have been described with reference to the accompanying drawings, it should be understood by those skilled in the art that various modifications may be made without departing from the scope of the present inventive concepts and without changing essential features thereof. Therefore, the above-described example embodiments should be considered in a descriptive sense only and not for purposes of limitation.

What is claimed is:

1. A semiconductor device comprising a substrate having a volatile memory region and a non-volatile memory region,
   wherein the volatile memory region comprises:
      a cell capacitor in the substrate; and
      a cell transistor connected to the cell capacitor,
   wherein the non-volatile memory region has a plurality of non-volatile memory cells at a higher level than an upper surface of the substrate, and the non-volatile memory region comprises:
      a plurality of mold layers and a plurality of non-volatile gate electrodes alternately and repeatedly stacked on the substrate; and
      a channel structure passing through the plurality of mold layers and the plurality of non-volatile gate electrodes,
   wherein the volatile memory region and the non-volatile memory region are side by side, and
   wherein the channel structure and the plurality of non-volatile gate electrodes constitute the plurality of non-volatile memory cells.

2. The semiconductor device of claim 1,
   wherein the cell capacitor is at a lower level than the upper surface of the substrate.

3. The semiconductor device of claim 1,
   wherein the cell capacitor comprises:
      a first electrode in the substrate;
      a second electrode facing the first electrode; and
      a capacitor dielectric layer between the first electrode and the second electrode, and
   wherein the second electrode is in a capacitor trench in the substrate.

4. The semiconductor device of claim 3,
   wherein the capacitor trench is disposed from the upper surface of the substrate toward an inside of the substrate, and
   wherein the capacitor trench has a height greater than a horizontal width.

5. The semiconductor device of claim 3, wherein a lower surface of the first electrode is at a lower level than a bottom of the capacitor trench.

6. The semiconductor device of claim 3,
   wherein the substrate comprises:
      a first well adjacent to the upper surface of the substrate;
      a second well at a lower level than that of the first well; and
      a third well at a lower level than that of the second well,
   wherein the second well is between the first well and the third well,
   wherein the first well and the third well contain first conductive impurities, and
   wherein the second well contains second conductive impurities different from the first conductive impurities.

7. The semiconductor device of claim 6, wherein a lower surface of the first electrode is at substantially the same level as a lower surface of the second well.

8. The semiconductor device of claim 6,
   wherein the first electrode comprises:
      an inner electrode adjacent to the capacitor trench; and
      an outer electrode surrounding an outer surface of the inner electrode, and
   wherein the capacitor dielectric layer is between the inner electrode and the second electrode.

9. The semiconductor device of claim 8, wherein the capacitor trench penetrates into the third well through the first well and the outer electrode.

10. The semiconductor device of claim 8, wherein a lowermost end of the inner electrode is at a lower level than a lower surface of the outer electrode.

11. The semiconductor device of claim 8, wherein a lowermost end of the inner electrode is at a lower level than an uppermost end of the third well.

12. The semiconductor device of claim 3,
    wherein the cell transistor comprises:
       a cell drain region;
       a cell source region spaced apart from the cell drain region; and
       a cell gate electrode between the cell drain region and the cell source region, and
    wherein the cell drain region is connected to the second electrode.

13. The semiconductor device of claim 12, wherein the cell gate electrode is in the substrate.

14. The semiconductor device of claim 12, wherein an upper surface of the cell gate electrode is at a lower level than an upper end of the substrate.

15. The semiconductor device of claim 1, wherein the channel structure comprises:
    a core pattern;
    a channel pattern surrounding the core pattern; and
    an information storage pattern between the channel pattern and the plurality of non-volatile gate electrodes.

16. The semiconductor device of claim 1,
    wherein the non-volatile memory region comprises:
       a plurality of first wires parallel to one another on the substrate; and
       a plurality of second wires parallel to one another and intersecting the plurality of first wires, and wherein the plurality of non-volatile memory cells are at intersections of the plurality of first wires and the plurality of second wires.

17. The semiconductor device of claim 1, further comprising a peripheral circuit region adjacent to the volatile memory region, wherein the peripheral circuit region has a peripheral transistor on the substrate.

18. The semiconductor device of claim 17, wherein the peripheral circuit region is between the volatile memory region and the non-volatile memory region.

19. A semiconductor device comprising:

a substrate;

a volatile memory cell in the substrate; and a non-volatile memory cell on the substrate, the non-volatile memory cell comprising:

a plurality of mold layers and a plurality of non-volatile gate electrodes alternately and repeatedly stacked on the substrate; and a channel structure passing through the plurality of mold layers and the plurality of non-volatile gate electrodes, wherein the non-volatile memory cell is at a higher level than an upper surface of the substrate, and wherein the channel structure and the plurality of non-volatile gate electrodes constitute the non-volatile memory cell.

\* \* \* \* \*